(12) United States Patent
Wang et al.

(10) Patent No.: US 8,519,458 B2
(45) Date of Patent: Aug. 27, 2013

(54) LIGHT-EMITTING ELEMENT DETECTION AND CLASSIFICATION DEVICE

(75) Inventors: Bily Wang, Hsinchu (TW); Kuei-Pao Chen, Hsinchu County (TW); Hsin-Cheng Chen, Hsinchu County (TW)

(73) Assignee: Youngtek Electronics Corporation, Hsinchu (TW)

( * ) Notice: Subject to any disclaimer, the term of this patent is extended or adjusted under 35 U.S.C. 154(b) by 116 days.

(21) Appl. No.: 13/182,425

(22) Filed: Jul. 13, 2011

(65) Prior Publication Data

US 2013/0015372 A1    Jan. 17, 2013

(51) Int. Cl.
*H01L 31/113*       (2006.01)
*G01N 21/01*        (2006.01)

(52) U.S. Cl.
USPC ............. 257/292; 257/98; 257/99; 250/491.1

(58) Field of Classification Search
USPC ................... 356/237.1–237.3; 362/231, 276, 362/153.1, 802, 269; 257/88, 91, 99, 98, 257/292; 438/26, 28, 29; 250/491.1
See application file for complete search history.

(56) References Cited

U.S. PATENT DOCUMENTS

| 8,242,715 | B2 * | 8/2012 | Van Endert et al. | 315/312 |
| 8,246,209 | B2 * | 8/2012 | Lai | 362/269 |
| 8,308,318 | B2 * | 11/2012 | Maxik | 362/231 |
| 2008/0012035 | A1 * | 1/2008 | Wang et al. | 257/99 |
| 2012/0285869 | A1 * | 11/2012 | Wang et al. | 209/575 |

\* cited by examiner

*Primary Examiner* — Sang Nguyen
(74) *Attorney, Agent, or Firm* — Li & Cai Intellectual Property (USA) Office

(57) ABSTRACT

A light-emitting element detection and classification device includes a rotation unit for transporting a plurality of light-emitting elements, a chip detection unit, and a chip classification unit. The rotation unit includes at least one rotary turntable, a plurality of receiving portions formed on the rotary turntable, and a plurality of suction-exhaust dual-purpose openings respectively disposed in the receiving portions, each receiving portion selectively receives at least one of the light-emitting elements. Each light-emitting element is an LED package chip having a positive electrode pad and a negative electrode pad disposed on the bottom side thereof. The chip detection unit includes at least one chip detection module adjacent to the rotation unit for detecting each light-emitting element. The chip classification unit includes at least one chip classification module adjacent to the rotation unit for classifying the LED package chips that have been detected by the at least one chip detection module.

14 Claims, 8 Drawing Sheets

LIGHT-EMITTING ELEMENT DETECTION AND CLASSIFICATION DEVICE

BACKGROUND OF THE INVENTION

1. Field of the Invention

The instant disclosure relates to a detection and classification device, and more particularly, to a light-emitting element detection and classification device for detecting and classifying light-emitting elements.

2. Description of Related Art

In the semiconductor fabricating process, some small particles and defects are unavoidable. As the size of devices shrinks and the integration of circuits increases gradually, those small particles or defects affect the property of the integrated circuits more seriously. For improving the reliability of semiconductor devices, a plurality of tests are performed continuously to find the root cause of the defects or particles. Then, process parameters can be tuned correspondingly to reduce a presence of defects or particles so as to improve the yield and reliability of the semiconductor fabricating process.

In the prior art, a sampling is first performed to select a semiconductor wafer as a sample for following defect detection and analysis in advance. Then, a defect inspection is performed. Normally, a proper defect inspection machine is utilized to scan in a large scale to detect all defects on the semiconductor wafer. Since there are too many defects on a semiconductor wafer, a manual defect review with the SEM cannot be directly performed for all defects in practice. A manual defect classification is typically performed before the defect review. After separating the defects into different defect types, some defects are sampled for the defect review. Then, a defect root cause analysis may be performed in advance according to the result of the defect review to attempt to reduce the defect generation.

Thus, with the increasing variety and sophistication of electronic devices, the quality and the reliability of the electronic components are crucial to the performance of the electronic devices. Generally, it is necessary for the components to be tested when the manufacturing procedure is finished. In the traditional inspection method, all the components are disposed on a large-area disk and many cameras are used for capturing the images of the surface appearances of the components. For inspecting the bottom surface of each component, the large-area disk has to be transparent. One method is using a quartz glass which is an expensive material as the large-area disk. However, the cost of a quartz glass inspection system is extremely high. Another method is using a tempered glass as the disk. However, the hardness of the tempered glass is lower than that of the electronic components so that the surface of the tempered glass is easily scratched by the components. The scratches on the tempered glass surface influence the captured bottom surface image and the analysis for the bottom surface images will not be precise. On the other hand, there are cameras disposed on both sides of the disk (i.e., top side and bottom side) and the images may not be in focus because of influence of light (i.e. glare or reflection) that passes though the large-area disk.

SUMMARY OF THE INVENTION

One particular aspect of the instant disclosure is to provide a light-emitting element detection and classification device for detecting and classifying light-emitting elements.

One of the embodiments of the instant disclosure provides a light-emitting element detection and classification device, comprising: a rotation unit for transporting a plurality of light-emitting elements, a chip detection unit, and a chip classification unit. The rotation unit includes at least one rotary turntable, a plurality of receiving portions formed on the rotary turntable, and a plurality of suction-exhaust dual-purpose openings respectively disposed in the receiving portions, each receiving portion selectively receives at least one of the light-emitting elements, and each light-emitting element is an LED package chip having a positive electrode pad and a negative electrode pad disposed on the bottom side thereof. The chip detection unit includes at least one chip detection module adjacent to the rotation unit for detecting each light-emitting element. The chip classification unit includes at least one chip classification module adjacent to the rotation unit for classifying the LED package chips that have been detected by the at least one chip detection module.

Furthermore, the light-emitting element detection and classification device further comprises: a bearing unit including at least one bearing base, wherein the at least one rotary turntable is disposed on the at least one bearing base. The receiving portions are surroundingly formed on the peripheral surface of the at least one rotary turntable. The light-emitting element detection and classification device further comprises: a transportation unit including at least one transportation element adjacent to the rotation unit for sequentially transporting each light-emitting element to the corresponding receiving portion. The light-emitting element detection and classification device further comprises: a polarity testing unit adjacent to the transportation unit and the rotation unit, wherein the polarity testing unit includes at least two pad polarity testing pins disposed under the LED package chip for judging whether the positions of the positive electrode pad and the negative electrode pad are correct. The light-emitting element detection and classification device further comprises: a polarity exchanging unit including a polarity exchanging module adjacent to the polarity testing unit to selectively exchange the position of the positive electrode pad with the position of the negative electrode pad. The polarity exchanging module includes a polarity exchanging base and a U-turn passage formed on the polarity exchanging base and communicating from one receiving portion to another receiving portion. The at least one chip detection module includes a power supply element under the LED package chip to supply power to the LED package chip and a detection element disposed above the LED package chip to judge the LED package chip is a luminous LED package chip or a non-luminous LED package chip. The at least one chip classification module includes at least one first passing portion for receiving each luminous LED package chip and at least one second passing portion for receiving each non-luminous LED package chip. The light-emitting element detection and classification device further comprise: a surface detection unit adjacent to the rotation unit and disposed between the at least one chip detection module and the at least one chip classification module, wherein the surface detection unit includes at least one top image capturing element disposed above the LED package chip.

One of the embodiments of the instant disclosure provides a light-emitting element detection and classification device, comprising: a rotation unit for transporting a plurality of light-emitting elements, a polarity testing unit, a polarity exchanging unit, a chip detection unit, a surface detection unit, and a chip classification unit. The rotation unit includes at least one rotary turntable, a plurality of receiving portions formed on the rotary turntable, and a plurality of suction-exhaust dual-purpose openings respectively disposed in the receiving portions, each receiving portion selectively receives at least one of the light-emitting elements, and each light-emitting element is an LED package chip having a positive electrode pad and a negative electrode pad disposed on the bottom side thereof. The polarity testing unit is adjacent to the rotation unit, wherein the polarity testing unit includes at least two pad polarity testing pins disposed under the LED package chip for judging whether the positions of the positive electrode pad and the negative electrode pad are correct. The polarity exchanging unit includes a polarity exchanging module adjacent to the polarity testing unit to selectively exchange the position of the positive electrode pad with the position of the negative electrode pad. The chip detection unit includes at least one chip detection module adjacent to the rotation unit and polarity exchanging unit for detecting each light-emitting element, wherein the polarity exchanging unit is disposed between the polarity testing unit and chip detection unit. The surface detection unit is adjacent to the rotation unit and the chip detection unit, wherein the surface detection unit includes at least one top image capturing element disposed above the LED package chip. The chip classification unit includes at least one chip classification module adjacent to the rotation unit for classifying the LED package chips that have been detected by the at least one chip detection module and the at least one top image capturing element, wherein the surface detection unit is disposed between the chip detection unit and the chip classification unit.

Furthermore, the polarity exchanging module includes a polarity exchanging base and a U-turn passage formed on the polarity exchanging base and communicating from one receiving portion to another receiving portion. The at least one chip detection module includes a power supply element under the LED package chip to supply power to the LED package chip and a detection element disposed above the LED package chip to judge the LED package chip is a luminous LED package chip or a non-luminous LED package chip. The at least one chip classification module includes at least one first passing portion for receiving each luminous LED package chip and at least one second passing portion for receiving each non-luminous LED package chip.

Therefore, the light-emitting element detection and classification device of the instant disclosure can be used to detect and classify the LED package LED by matching the rotation unit, the chip detection unit, and the chip classification unit.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

Referring to FIGS. 1 to 5C, the first embodiment of the instant disclosure provides a light-emitting element detection and classification device, comprising: a rotation unit 1 for transporting a plurality of light-emitting elements, a chip detection unit 2, and a chip classification unit 3.

Figure 1:
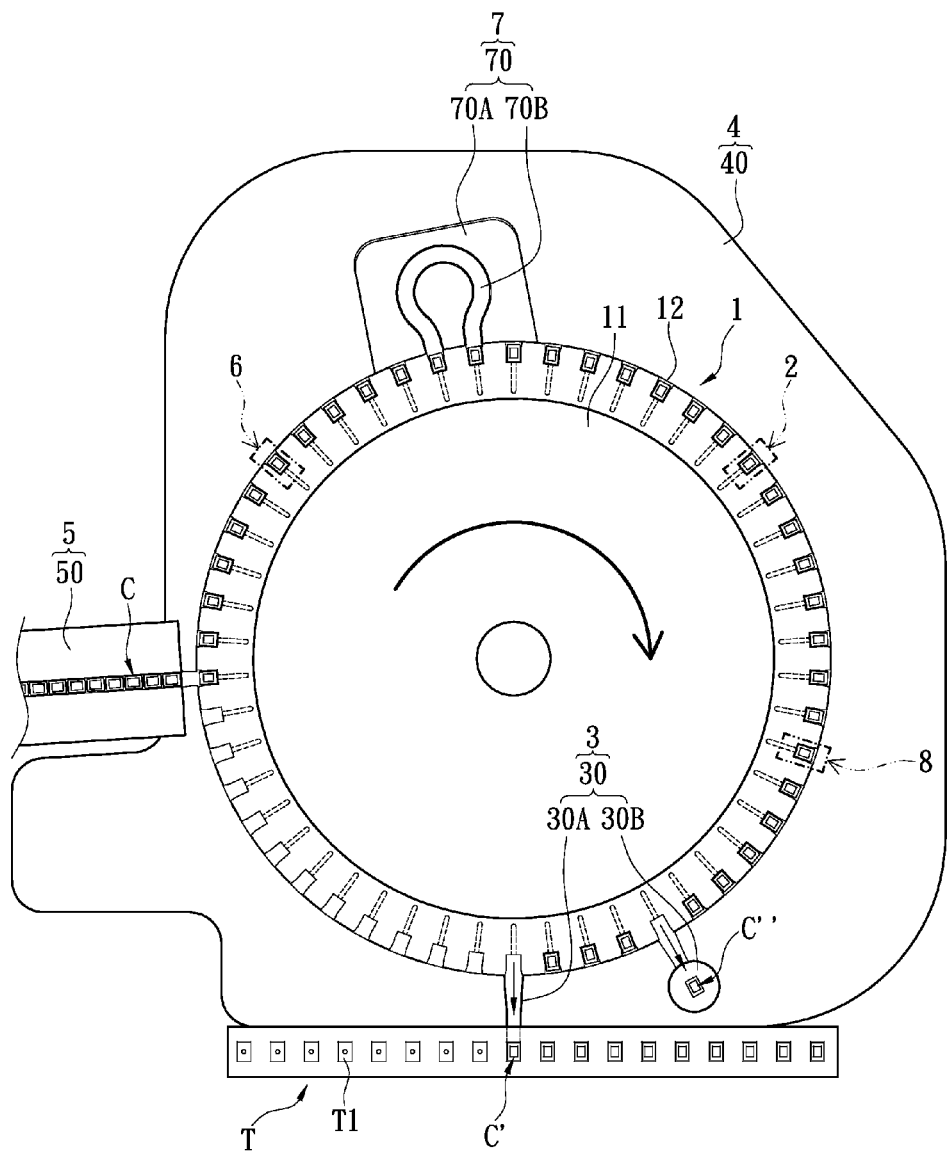
FIG. 1 shows a top, schematic view of the light-emitting element detection and classification device according to the instant disclosure.
Figure 2:
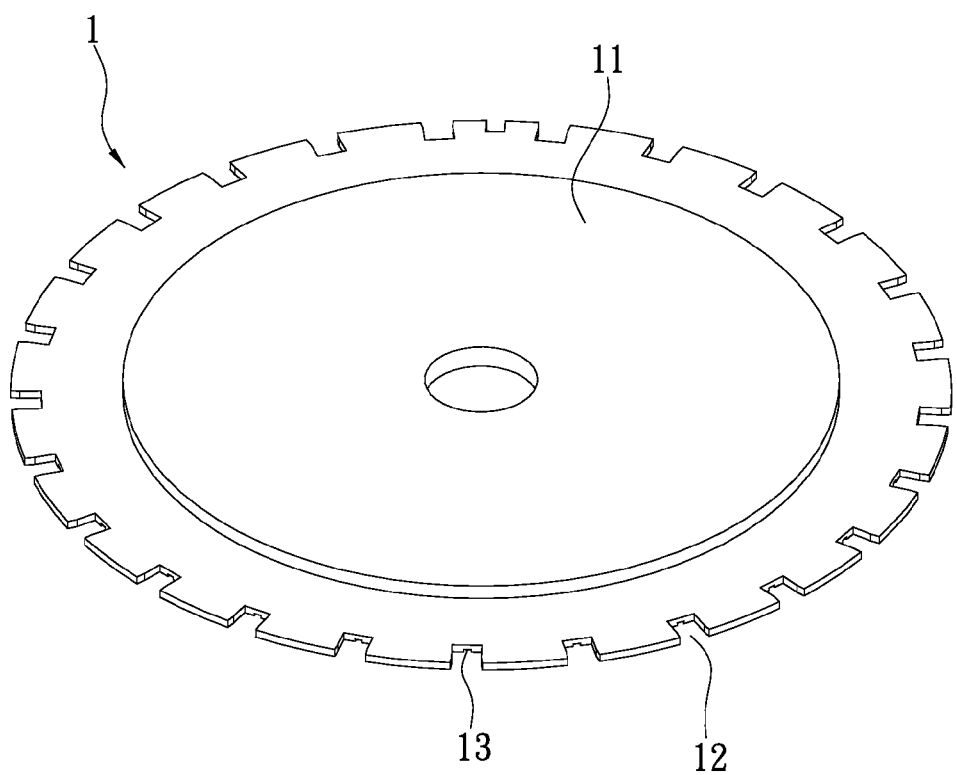
FIG. 2 shows a perspective, schematic view of the rotation unit of the light-emitting element detection and classification device according to the instant disclosure.

Referring to FIGS. 1 and 2, the rotation unit 1 includes at least one rotary turntable 11, a plurality of receiving portions 12 (such as accommodating spaces) formed on the rotary turntable 11, and a plurality of suction-exhaust dual-purpose openings 13 respectively disposed in the receiving portions 12. Each receiving portion 12 is used to selectively receive at least one of the light-emitting elements, and each light-emitting element may be an LED package chip C having a positive electrode pad C1 and a negative electrode pad C2 disposed on the bottom side thereof. For example, the receiving portions 12 are surroundingly formed on the peripheral surface of the at least one rotary turntable 11 as shown in FIG. 2 and each receiving portion 12 has an outward opening, thus each LED package chip C can enter the receiving portion 12 through the outward opening.

Moreover, the light-emitting element detection and classification device of the instant disclosure further comprises a bearing unit 4 and a transportation unit 5. The bearing unit 4 includes at least one bearing base 40, and the at least one rotary turntable 11 can be disposed on the at least one bearing base 40. The transportation unit 5 includes at least one transportation element 50 adjacent to the rotation unit 1 for sequentially transporting each LED package chip C to the corresponding receiving portion 12. For example, each LED package chip C can be sequentially conveyed from the at least one transportation element 50 into each corresponding receiving portion 12, the at least one rotary turntable 11 can be fixed on the at least one bearing base 40 through a plurality of bolts (not shown), and the LED package chips C can be conveyed clockwise as the direction of the arrow shown in FIG. 1 due to the rotation function of the at least one rotary turntable 11.

Furthermore, the chip detection unit 2 includes at least one chip detection module 20 adjacent to the rotation unit 1 for detecting each light-emitting element. Of course, the instant disclosure can use a plurality of chip detection module 20 at the same time according to different requirements. In addition, the at least one chip detection module 20 includes a power supply element 20A under the LED package chip C to supply power to the LED package chip C and a detection element 20B disposed above the LED package chip C to judge the LED package chip C is a luminous LED package chip C' or a non-luminous LED package chip C". For example, the power supply element 20A may be two conductive pins 200A for supplying positive power source and negative power source to the LED package chip C, and the detection element 20B may be a light sensor for evaluating whether the LED package chip C is lightened.

Figure 3A:
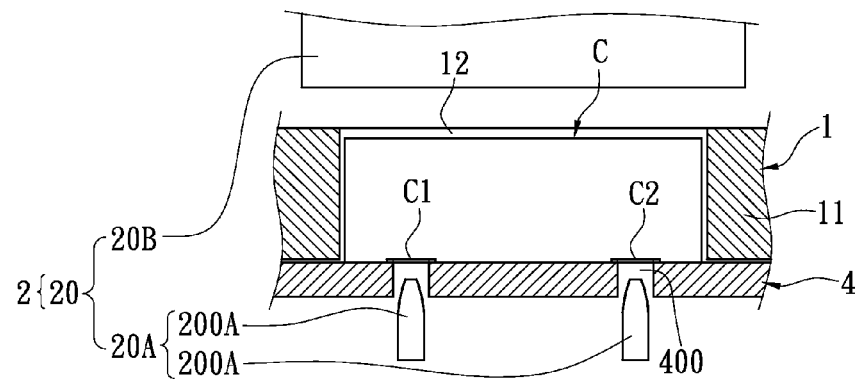
FIG. 3A shows a lateral, cross-sectional, schematic view of before using the chip detection unit to detect the LED package chip according to the instant disclosure.
Figure 3B:
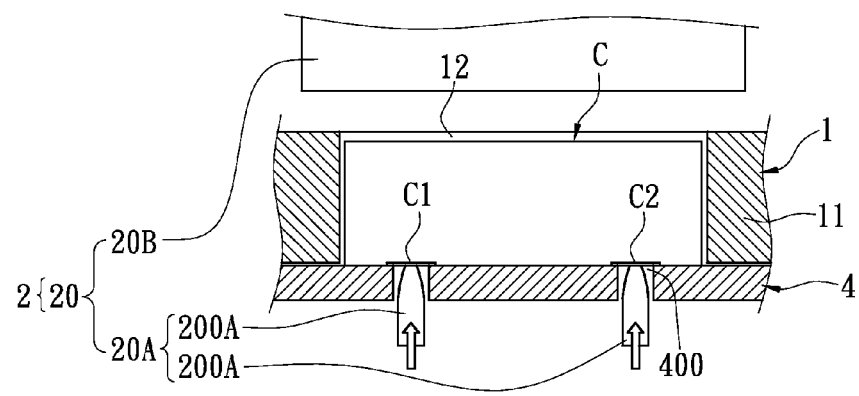
FIG. 3B shows a lateral, cross-sectional, schematic view of when the chip detection unit used to detect the LED package chip according to the instant disclosure.
Figure 3C:
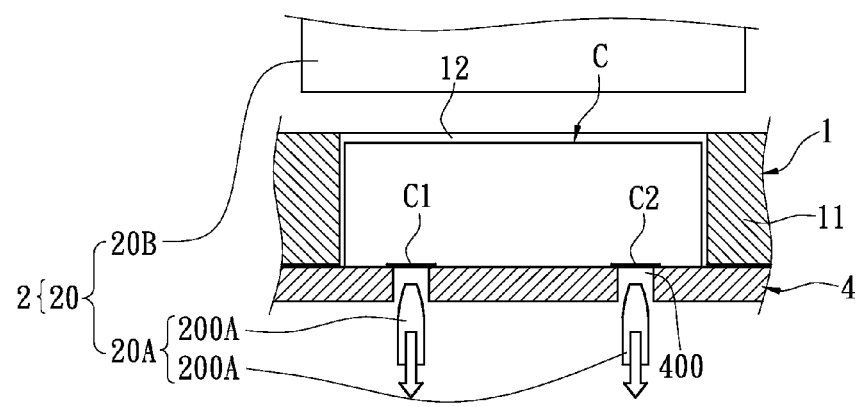
FIG. 3C shows a lateral, cross-sectional, schematic view of after using the chip detection unit to detect the LED package chip according to the instant disclosure.

The detection method of the at least one chip detection module 20 is shown in FIGS. 3A to 3C. Before using the at least one chip detection module 20 to detect the LED package chip C as shown in FIG. 3A, the LED package chip C is disposed is received in the corresponding receiving portion 12 of the rotation unit 1 and above the power supply element 20A. When the at least one chip detection module 20 is used to detect the LED package chip C as shown in FIG. 3B, the two conductive pins 200A of the power supply element 20A are moved upwardly (as the direction of the arrow shown in FIG. 3B) at the same time to pass through the openings 400 of the bearing base 40 and the two conductive pins 200A respectively electrically contact the positive electrode pad C1 and the negative electrode pad C2 of the LED package chip C. At this time, when the LED package chip C is lightened, the LED package chip C is evaluated as the luminous LED package chip C', and when the LED package chip C is not lightened, the LED package chip C is evaluated as the non-luminous LED package chip C". After using the at least one chip detection module 20 to detect the LED package chip C as shown in FIG. 3B, the two conductive pins 200A of the power supply element 20A are moved downwardly (as the direction of the arrow shown in FIG. 3C) to go back the original position as shown in FIG. 3A at the same time.

In addition, the chip classification unit 3 includes at least one chip classification module 30 adjacent to the rotation unit 1 for classifying the LED package chips C that have been detected by the at least one chip detection module 20. Moreover, the at least one chip classification module 30 includes at least one first passing portion 30A for receiving each luminous LED package chip C' and at least one second passing portion 30B for receiving each non-luminous LED package chip C". In general, when each luminous LED package chips C' passes through the at least one first passing portion 30A, each luminous LED package chips C' can be embedded into the package groove Ti of the rolling tape T. When each non-luminous LED package chips C" passes through the at least one second passing portion 30B, each non-luminous LED package chips C" is collected in the same vessel to proceed other fabrication process.

Moreover, the light-emitting element detection and classification device further comprises a polarity testing unit 6 adjacent to the transportation unit 5 and the rotation unit 1. The polarity testing unit 6 includes at least two pad polarity testing pins 60 disposed under the LED package chip C for judging whether the positions of the positive electrode pad C1 and the negative electrode pad C2 are correct. For example, the at least two pad polarity testing pins 60 can respectively supply the positive power source and the negative power source to the positive electrode pad C1 and the negative electrode pad C2 of the LED package chip C. Therefore, if the at least two pad polarity testing pins 60 respectively contact the positive electrode pad C1 and the negative electrode pad C2 of the LED package chip C, the LED package chip C can be lightened as the luminous LED package chips C' (it means the positions of the positive electrode pad C1 and the negative electrode pad C2 are correct). If the at least two pad polarity testing pins 60 respectively contact the negative electrode pad C2 and the positive electrode pad C1 of the LED package chip C, the LED package chip C cannot be lightened as the non-luminous LED package chips C" (it means the positions of the positive electrode pad C1 and the negative electrode pad C2 are not correct).

Figure 4A:
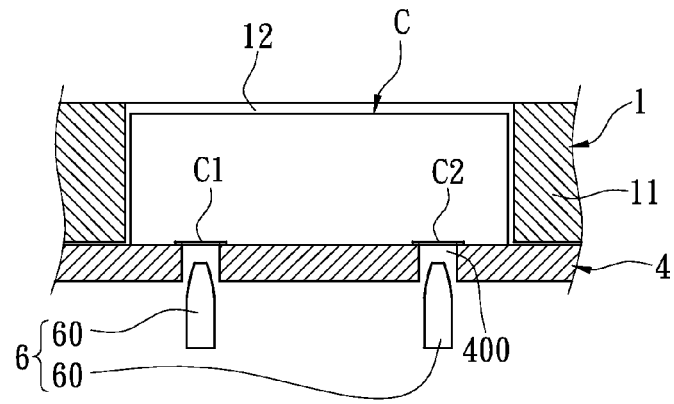
FIG. 4A shows a lateral, cross-sectional, schematic view of before using the polarity testing unit to detect the LED package chip according to the instant disclosure.
Figure 4B:
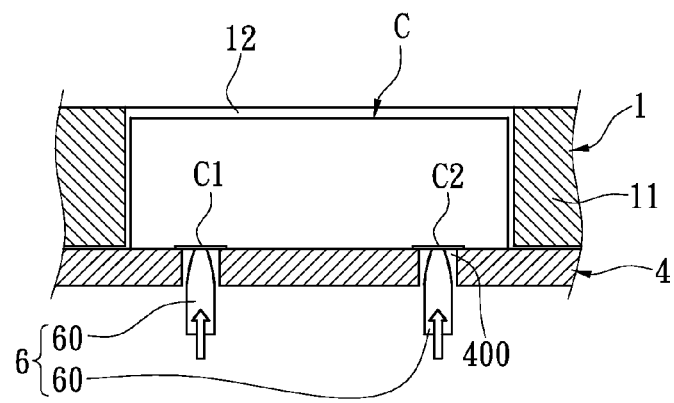
FIG. 4B shows a lateral, cross-sectional, schematic view of when the polarity testing unit used to detect the LED package chip according to the instant disclosure.
Figure 4C:
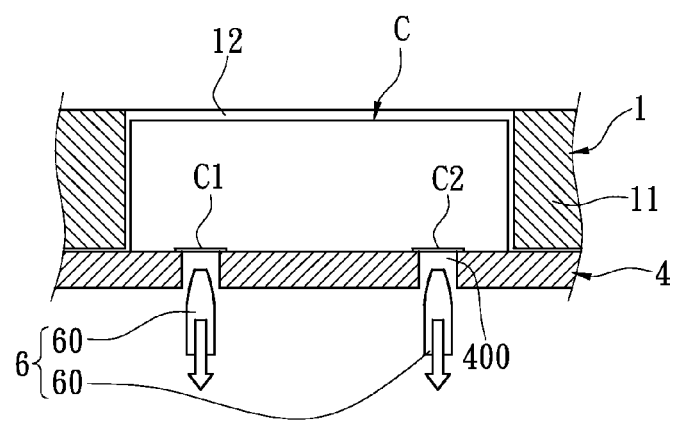
FIG. 4C shows a lateral, cross-sectional, schematic view of after using the polarity testing unit to detect the LED package chip according to the instant disclosure.

The test method of the polarity testing unit 6 is shown in FIGS. 4A to 4C. Before using the polarity testing unit 6 to test the LED package chip C as shown in FIG. 4A, the LED package chip C is received in the corresponding receiving portion 12 of the rotation unit 1 and above the polarity testing unit 6. When the polarity testing unit 6 is used to detect the LED package chip C as shown in FIG. 4B, the at least two pad polarity testing pins 60 are moved upwardly (as the direction of the arrow shown in FIG. 4B) at the same time to pass through the openings 400 of the bearing base 40 and the at least two pad polarity testing pins 60 respectively electrically contact the positive electrode pad C1 and the negative electrode pad C2 of the LED package chip C. At this time, when the LED package chip C is lightened, judging the positions of the positive electrode pad C1 and the negative electrode pad C2 of the LED package chip C are correct, and when the LED package chip C is not be lightened, judging the positions of the positive electrode pad C1 and the negative electrode pad C2 of the LED package chip C are incorrect. After using the polarity testing unit 6 to detect the LED package chip C as shown in FIG. 4C, the at least two pad polarity testing pins 60 are moved downwardly (as the direction of the arrow shown in FIG. 4C) to go back the original position as shown in FIG. 4A at the same time.

Furthermore, referring to FIGS. 1, and 5A to 5C, the light-emitting element detection and classification device further comprises a polarity exchanging unit 7 including a polarity exchanging module 70 adjacent to the polarity testing unit 6 to selectively exchange the position of the positive electrode pad C1 with the position of the negative electrode pad C2. In addition, the polarity exchanging module 70 includes a polarity exchanging base 70A and a U-turn passage 70B formed on the polarity exchanging base 70A and communicating from one receiving portion 12 to another receiving portion 12. When the position of the positive electrode pad C1 and the position of the negative electrode pad C2 of the LED package chip C are incorrect or opposite, the LED package chip C can be rotated by the polarity exchanging unit 7, thus the positive electrode pad C1 and the negative electrode pad C2 of each LED package chip C would be corrected.

Figure 5A:
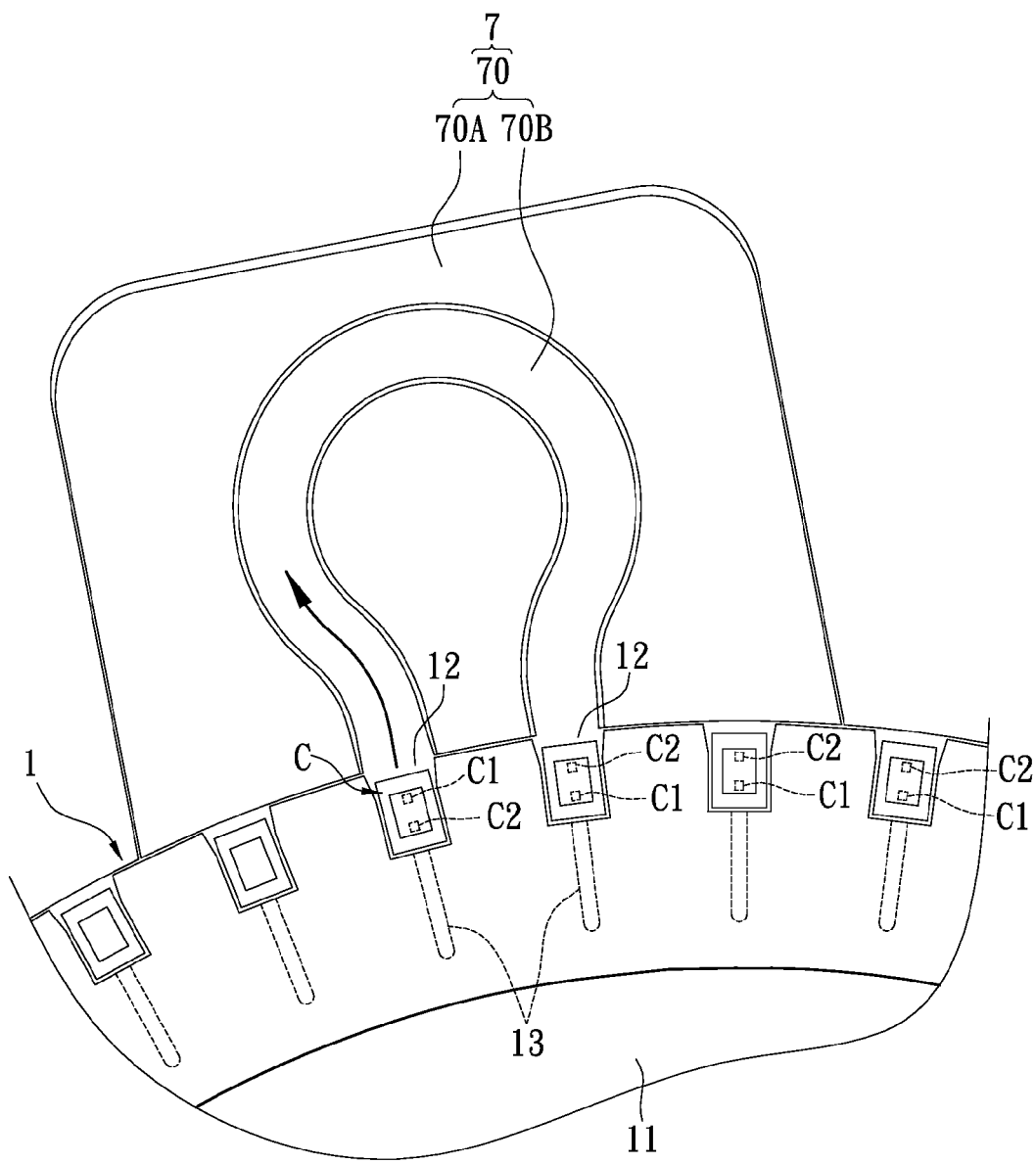
FIG. 5A shows a top, schematic view of the LED package chip received in one receiving portion according to the instant disclosure.
Figure 5B:
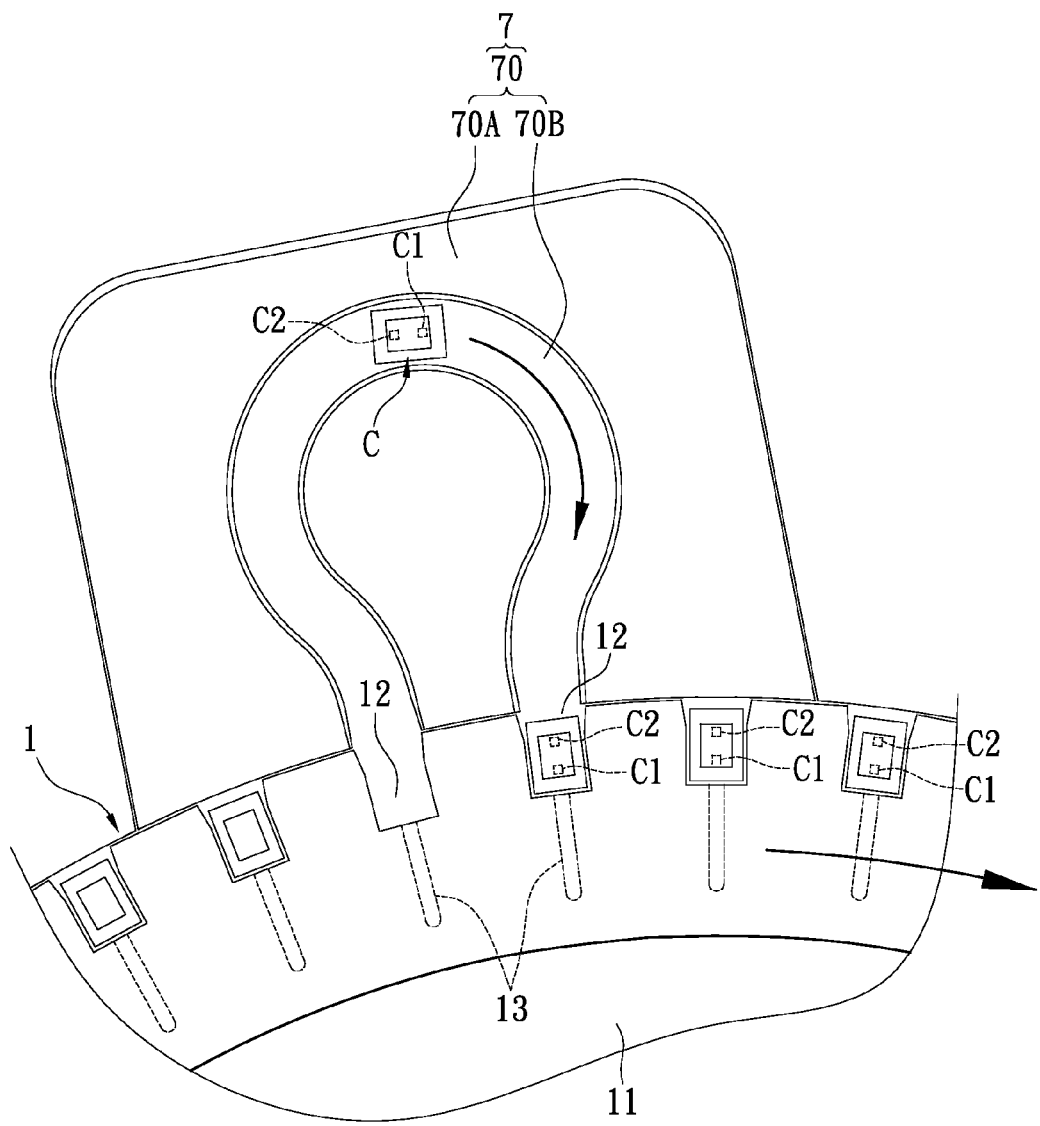
FIG. 5B shows a top, schematic view of the LED package chip received in the U-turn passage according to the instant disclosure.
Figure 5C:
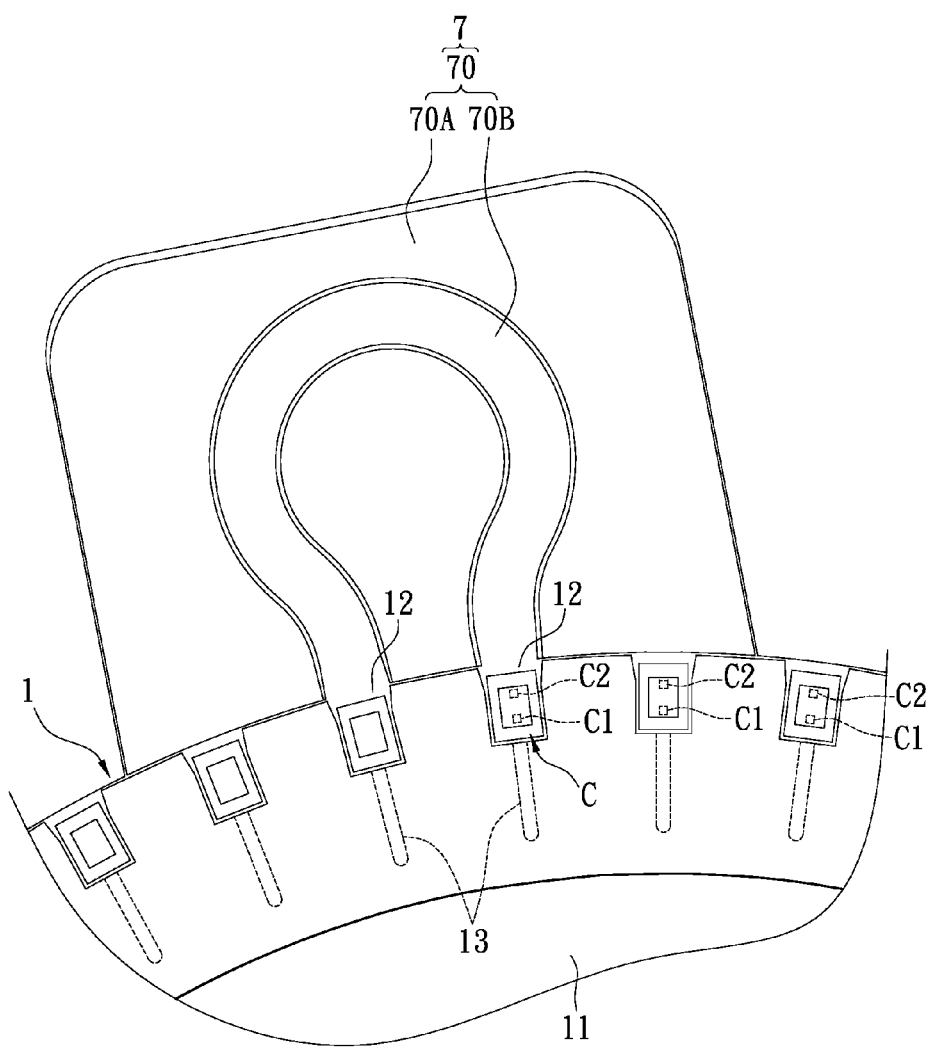
FIG. 5C shows a top, schematic view of the LED package chip received in another receiving portion according to the instant disclosure.

For example, when the position of the positive electrode pad C1 and the position of the negative electrode pad C2 of the LED package chip C are incorrect as shown in FIG. 5A, an airflow can pass through one suction-exhaust dual-purpose opening 13 to blow the LED package chip C from one receiving portion 12 to the U-turn passage 70B as shown from FIG. 5A to 5B. When the LED package chip C is close to another receiving portion 12, the LED package chip C can be attracted by another suction-exhaust dual-purpose opening 13 for moving the LED package chip C from the U-turn passage 70B into another receiving portion 12 as shown in FIG. 5C. At this time, the LED package chip C is rotated horizontally by 180 degrees, thus the position of the positive electrode pad C1 and the position of the negative electrode pad C2 of the LED package chip C relative to the two conductive pins 200A of the power supply element 20A are exchanged.

Figure 6:
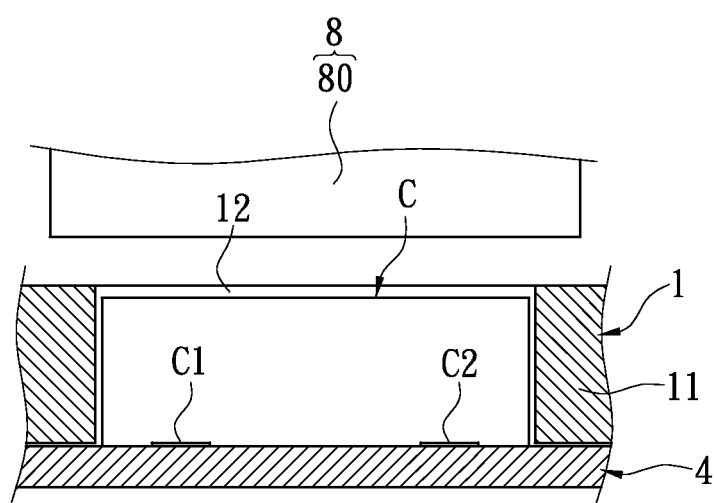
FIG. 6 shows a lateral, cross-sectional, schematic view of the surface detection unit for capturing the top surface image of the LED package chip according to the instant disclosure.

In addition, the light-emitting element detection and classification device further comprises a surface detection unit 8 adjacent to the rotation unit 1 and disposed between the at least one chip detection module 20 and the at least one chip classification module 30, and the surface detection unit 8 includes at least one top image capturing element 80 disposed above the LED package chip C. After the LED package chip C has been detected by the chip detection unit 2, the LED package chip C can be transported from one position above the detection element 20B to another position under the at least one top image capturing element 80 by the rotary turntable 11 as shown in FIG. 6. In other words, the top surface image of the LED package chips C can be captured by the at least one top image capturing element 80 (such as a digital camera). Hence, the LED package chips C with good top surface image can be sifted out by the at least one top image capturing element 80.

In conclusion, the light-emitting element detection and classification device of the instant disclosure can be used to detect and classify the LED package LED by matching the rotation unit, the chip detection unit, and the chip classification unit.

One of the embodiments of the instant disclosure provides a light-emitting element detection and classification device, comprising: a rotation unit for transporting a plurality of light-emitting elements, a chip detection unit, and a chip classification unit. The rotation unit includes at least one rotary turntable, a plurality of receiving portions formed on the rotary turntable, and a plurality of suction-exhaust dual-purpose openings respectively disposed in the receiving portions, each receiving portion selectively receives at least one of the light-emitting elements, and each light-emitting element is an LED package chip having a positive electrode pad and a negative electrode pad disposed on the bottom side thereof. The chip detection unit includes at least one chip detection module adjacent to the rotation unit for detecting each light-emitting element. The chip classification unit includes at least one chip classification module adjacent to the rotation unit for classifying the LED package chips that have been detected by the at least one chip detection module. Furthermore, the light-emitting element detection and classification device further comprises: a polarity testing unit adjacent to the transportation unit and the rotation unit, wherein the polarity testing unit includes at least two pad polarity testing pins disposed under the LED package chip for judging whether the positions of the positive electrode pad and the negative electrode pad are correct. The light-emitting element detection and classification device further comprises: a polarity exchanging unit including a polarity exchanging module adjacent to the polarity testing unit to selectively exchange the position of the positive electrode pad with the position of the negative electrode pad.

Another one of the embodiments of the instant disclosure provides a light-emitting element detection and classification device, comprising: a rotation unit for transporting a plurality of light-emitting elements, a polarity testing unit, a polarity exchanging unit, a chip detection unit, a surface detection unit, and a chip classification unit. The rotation unit includes at least one rotary turntable, a plurality of receiving portions formed on the rotary turntable, and a plurality of suction-exhaust dual-purpose openings respectively disposed in the receiving portions, each receiving portion selectively receives at least one of the light-emitting elements, and each light-emitting element is an LED package chip having a positive electrode pad and a negative electrode pad disposed on the bottom side thereof. The polarity testing unit is adjacent to the rotation unit, wherein the polarity testing unit includes at least two pad polarity testing pins disposed under the LED package chip for judging whether the positions of the positive electrode pad and the negative electrode pad are correct. The polarity exchanging unit includes a polarity exchanging module adjacent to the polarity testing unit to selectively exchange the position of the positive electrode pad with the position of the negative electrode pad. The chip detection unit includes at least one chip detection module adjacent to the rotation unit and polarity exchanging unit for detecting each light-emitting element, wherein the polarity exchanging unit is disposed between the polarity testing unit and chip detection unit. The surface detection unit is adjacent to the rotation unit and the chip detection unit, wherein the surface detection unit includes at least one top image capturing element disposed above the LED package chip. The chip classification unit includes at least one chip classification module adjacent to the rotation unit for classifying the LED package chips that have been detected by the at least one chip detection module and the at least one top image capturing element, wherein the surface detection unit is disposed between the chip detection unit and the chip classification unit.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A light-emitting element detection and classification device, comprising:
    a rotation unit for transporting a plurality of light-emitting elements, wherein the rotation unit includes at least one rotary turntable, a plurality of receiving portions formed on the rotary turntable, and a plurality of suction-exhaust dual-purpose openings respectively disposed in the receiving portions, each receiving portion selectively receives at least one of the light-emitting elements, and each light-emitting element is an LED package chip having a positive electrode pad and a negative electrode pad disposed on the bottom side thereof;
    a chip detection unit including at least one chip detection module adjacent to the rotation unit for detecting each light-emitting element;
    a chip classification unit including at least one chip classification module adjacent to the rotation unit for classifying the LED package chips that have been detected by the at least one chip detection module; and
    a polarity testing unit adjacent to the rotation unit, wherein the polarity testing unit includes at least two pad polarity testing pins disposed under the LED package chip for judging whether the positions of the positive electrode pad and the negative electrode pad are correct.

2. The light-emitting element detection and classification device of claim 1, further comprising: a bearing unit including at least one bearing base, wherein the at least one rotary turntable is disposed on the at least one bearing base.

3. The light-emitting element detection and classification device of claim 1, wherein the receiving portions are surroundingly formed on the peripheral surface of the at least one rotary turntable.

4. The light-emitting element detection and classification device of claim 1, further comprising: a transportation unit including at least one transportation element adjacent to the rotation unit for sequentially transporting each light-emitting element to the corresponding receiving portion.

5. The light-emitting element detection and classification device of claim 4, wherein the polarity testing unit is adjacent to the transportation unit.

6. The light-emitting element detection and classification device of claim 1, further comprising: a polarity exchanging unit including a polarity exchanging module adjacent to the polarity testing unit to selectively exchange the position of the positive electrode pad with the position of the negative electrode pad.

7. The light-emitting element detection and classification device of claim 6, wherein the polarity exchanging module includes a polarity exchanging base and a U-turn passage formed on the polarity exchanging base and communicating from one receiving portion to another receiving portion.

8. The light-emitting element detection and classification device of claim 1, wherein the at least one chip detection module includes a power supply element under the LED package chip to supply power to the LED package chip and a detection element disposed above the LED package chip to judge the LED package chip is a luminous LED package chip or a non-luminous LED package chip.

9. The light-emitting element detection and classification device of claim 8, wherein the at least one chip classification module includes at least one first passing portion for receiving each luminous LED package chip and at least one second passing portion for receiving each non-luminous LED package chip.

10. The light-emitting element detection and classification device of claim 1, further comprising: a surface detection unit adjacent to the rotation unit and disposed between the at least one chip detection module and the at least one chip classification module, wherein the surface detection unit includes at least one top image capturing element disposed above the LED package chip.

11. A light-emitting element detection and classification device, comprising:
  a rotation unit for transporting a plurality of light-emitting elements, wherein the rotation unit includes at least one rotary turntable, a plurality of receiving portions formed on the rotary turntable, and a plurality of suction-exhaust dual-purpose openings respectively disposed in the receiving portions, each receiving portion selectively receives at least one of the light-emitting elements, and each light-emitting element is an LED package chip having a positive electrode pad and a negative electrode pad disposed on the bottom side thereof;
  a polarity testing unit adjacent to the rotation unit, wherein the polarity testing unit includes at least two pad polarity testing pins disposed under the LED package chip for judging whether the positions of the positive electrode pad and the negative electrode pad are correct;
  a polarity exchanging unit including a polarity exchanging module adjacent to the polarity testing unit to selectively exchange the position of the positive electrode pad with the position of the negative electrode pad;
  a chip detection unit including at least one chip detection module adjacent to the rotation unit and polarity exchanging unit for detecting each light-emitting element, wherein the polarity exchanging unit is disposed between the polarity testing unit and chip detection unit;
  a surface detection unit adjacent to the rotation unit and the chip detection unit, wherein the surface detection unit includes at least one top image capturing element disposed above the LED package chip; and
  a chip classification unit including at least one chip classification module adjacent to the rotation unit for classifying the LED package chips that have been detected by the at least one chip detection module and the at least one top image capturing element, wherein the surface detection unit is disposed between the chip detection unit and the chip classification unit.

12. The light-emitting element detection and classification device of claim 11, wherein the polarity exchanging module includes a polarity exchanging base and a U-turn passage formed on the polarity exchanging base and communicating from one receiving portion to another receiving portion.

13. The light-emitting element detection and classification device of claim 11, wherein the at least one chip detection module includes a power supply element under the LED package chip to supply power to the LED package chip and a detection element disposed above the LED package chip to judge the LED package chip is a luminous LED package chip or a non-luminous LED package chip.

14. The light-emitting element detection and classification device of claim 13, wherein the at least one chip classification module includes at least one first passing portion for receiving each luminous LED package chip and at least one second passing portion for receiving each non-luminous LED package chip.

* * * * *